(12) United States Patent
Lee et al.

(10) Patent No.: US 10,373,978 B2
(45) Date of Patent: Aug. 6, 2019

(54) LIGHT EMITTING DISPLAY DEVICE

(71) Applicant: SAMSUNG DISPLAY CO., LTD., Yongin-si, Gyeonggi-do (KR)

(72) Inventors: Baek Hee Lee, Yongin-si (KR); Keun Chan Oh, Hwaseong-si (KR); Jae Jin Lyu, Yongin-si (KR); Hyeok Jin Lee, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/717,764

(22) Filed: Sep. 27, 2017

(65) Prior Publication Data

US 2018/0211979 A1  Jul. 26, 2018

(30) Foreign Application Priority Data

Jan. 25, 2017 (KR) .................. 10-2017-0011931

(51) Int. Cl.
*H01L 27/12* (2006.01)
*H01L 27/32* (2006.01)
(Continued)

(52) U.S. Cl.
CPC ...... *H01L 27/1222* (2013.01); *H01L 27/1218* (2013.01); *H01L 27/322* (2013.01);
(Continued)

(58) Field of Classification Search
CPC .................. H01L 51/0032–51/0095; H01L 51/50–51/5237; H01L 51/5262;
(Continued)

(56) References Cited

U.S. PATENT DOCUMENTS 7,750,984 B2  7/2010 Ha et al.
9,184,403 B2  11/2015 Cho et al.
(Continued)

FOREIGN PATENT DOCUMENTS

KR  10-2016-0059071 A  5/2016
KR  10-2016-0086490 A  7/2016
KR  10-2016-0086739 A  7/2016

OTHER PUBLICATIONS

Sang-Hwan Cho, Highly Efficient Phosphor-converted White Organic Light-emitting Diodes with Moderate Microcavity and Light-recycling Filters, Optics Express, Jan. 8, 2010, 6 pages, vol. 18 No. 2, Korea.
(Continued)

*Primary Examiner* — Natalia A Gondarenko
(74) *Attorney, Agent, or Firm* — Innovation Counsel LLP

(57) ABSTRACT

A light emitting display device according to an exemplary embodiment of the present disclosure includes: a first substrate; an insulating layer disposed on the first substrate and having an inclined portion; a first electrode disposed on the insulating layer; a light-emitting layer disposed on the first electrode; a second electrode disposed on the light-emitting layer; and a plurality of color conversion layers disposed on the second electrode. The first electrode includes an inclined portion that is inclined along the inclined portion of the insulating layer based on a surface parallel to the first substrate, and the light-emitting layer includes semiconductor nano-particles.

11 Claims, 15 Drawing Sheets

(51) Int. Cl.

| | | |
|---|---|---|
| *H01L 33/12* | (2010.01) | |
| *H01L 33/40* | (2010.01) | |
| *H01L 33/50* | (2010.01) | |
| *H01L 33/60* | (2010.01) | |
| *H01L 51/50* | (2006.01) | |
| *H01L 51/52* | (2006.01) | |
| *H01L 51/56* | (2006.01) | |

(52) U.S. Cl.
CPC .......... *H01L 27/3258* (2013.01); *H01L 33/12* (2013.01); *H01L 33/405* (2013.01); *H01L 33/60* (2013.01); *H01L 51/502* (2013.01); *H01L 51/5209* (2013.01); *H01L 2933/0091* (2013.01)

(58) Field of Classification Search
CPC ......... H01L 51/54; H01L 51/56; H01L 27/15; H01L 27/32–27/3293; H01L 27/3202–27/3204; H01L 27/3241–27/3297; H01L 33/08; H01L 2227/322; H01L 2227/326; H01L 27/1218; H01L 27/1222; H01L 33/405; H01L 33/12; H01L 2933/0091; H01L 27/3225–27/3234; H01L 27/3246; H01L 27/3248; H01L 27/3251; H01L 27/3258; H01L 27/326; H01L 33/50–33/508; H01L 33/52–33/56; H01L 33/58–33/60; H01L 33/62; H01L 2251/5369; H01L 2933/0016; H01L 2933/0041; H01L 2933/005; H01L 2933/0058; H01L 33/36; H01L 33/38; H01L 33/382–33/387; H01L 33/44

USPC ..... 257/28, 59, 71, 72, 40, 98, 99, E51.022, 257/E51.027, E51.026, E51.018, 88, 257/E21.158; 438/29, 34, 761

See application file for complete search history.

(56) References Cited

U.S. PATENT DOCUMENTS

| | | | |
|---|---|---|---|
| 2008/0024402 | A1 | 1/2008 | Nishikawa et al. |
| 2011/0297943 | A1 | 12/2011 | Kim et al. |
| 2013/0001603 | A1* | 1/2013 | Lim .................. H01L 51/5209 257/88 |
| 2013/0234590 | A1* | 9/2013 | Li .......................... H05B 33/24 313/509 |
| 2014/0008618 | A1* | 1/2014 | Lim .................. H01L 51/5268 257/40 |
| 2014/0239259 | A1* | 8/2014 | Lim .................. H01L 51/5281 257/40 |
| 2015/0076457 | A1 | 3/2015 | Kwon et al. |
| 2015/0102325 | A1 | 4/2015 | Lim et al. |
| 2015/0194634 | A1 | 7/2015 | Kang et al. |
| 2016/0079316 | A1* | 3/2016 | Zhou .................. H01L 51/5278 257/13 |
| 2016/0240821 | A1* | 8/2016 | Carroll .................. H01L 51/50 |
| 2016/0275863 | A1 | 9/2016 | Kimura et al. |
| 2016/0293875 | A1 | 10/2016 | Zhang et al. |
| 2017/0278911 | A1* | 9/2017 | Toyoda ............... H01L 51/5271 |
| 2018/0006258 | A1* | 1/2018 | Kim ..................... G02B 17/026 |

OTHER PUBLICATIONS

Geraldine Dantelle, How to Prepare the Brightest Luminescent Coatings?, ACS Applied Materials & Interfaces, Oct. 21, 2013, pp. 11315-11320, American Chemical Society, France.

European Search Report corresponding to EP Application No. 17208697.7, dated Jun. 25, 2018, 8 pages.

\* cited by examiner

LIGHT EMITTING DISPLAY DEVICE

CROSS-REFERENCE TO DELATED APPLICATION

This application claims priority to and the benefit of Korean Patent Application No. 10-2017-0011931 filed in the Korean Intellectual Property Office on Jan. 25, 2017, the entire contents of which are incorporated herein by reference.

BACKGROUND (a) Technical Field

The present disclosure relates to a light emitting display device.

(b) Description of the Related Art

A light emitting display device includes light emitting elements that consist of a hole injection electrode, an emission layer, and an electron injection electrode. Each light emitting element emits light using energy generated when excitons, which are created by combining electrons with holes, fall from an exited state to a ground state inside the emission layer, and using such light emission, the light emitting display device displays a predetermined image.

A light emitting display device generally has a structure in which an anode and a cathode are disposed to face each other on an insulating layer covering a thin film transistor provided on a substrate and in which an emission layer is disposed between the anode and the cathode. However, since light generated from the emission layer is partially or totally reflected between the emission layer and the electrodes, efficiency of light transmitted to the outside decreases.

In addition, color shift in which the color shade varies depending on the angle of the view may occur.

The above information disclosed in this Background section is only for enhancement of understanding of the background and therefore it may contain information that does not form the prior art that is already known in this country to a person of ordinary skill in the art.

SUMMARY

A feature of the present disclosure is to provide a light emitting display device that is capable of improving color reproducibility and reducing color shift associated with a viewing angle.

However, the feature of the present disclosure is limited to the aforementioned one, and may be extended in various ways within the spirit and scope of the present disclosure.

A light emitting display device according to an exemplary embodiment of the present disclosure includes: a first substrate; an insulating layer disposed on the first substrate and having an inclined portion; a first electrode disposed on the insulating layer; a light-emitting layer disposed on the first electrode; a second electrode disposed on the light-emitting layer; and a plurality of color conversion layers disposed on the second electrode. The first electrode includes an inclined portion that is inclined along the inclined portion of the insulating layer based on a surface parallel to the first substrate, and the light-emitting layer includes semiconductor nano-particles.

The light-emitting display device may further include a pixel defining layer disposed on the insulating layer, wherein the pixel defining layer may overlap a side surface of the inclined portion of the insulating layer.

The tight-emitting display device may further include a planarization layer disposed between the first substrate and the insulating layer, wherein the inclined portion of the first electrode disposed on the inclined portion of the insulating layer may extend such that the second electrode is disposed on the planarization layer. The pixel defining layer may include scattering particles having a nano-structure that are dispersed.

The inclined portion of the insulating layer may have an inclination angle that is greater than 0 degrees and smaller than 90 degrees.

The first electrode may include a reflecting material.

The first electrode may include a plurality of protrusions.

The emission layer may include a quantum dot emitting blue.

The plurality of color conversion layers may include a first color conversion layer and a second color conversion layer, wherein the light emitting display device further includes a transmission layer adjacent to at least one selected from the group consisting of the first color conversion layer and the second color conversion layer in a direction parallel to an upper surface of the first substrate, and the transmission layer may include a plurality of scatterers.

The light-emitting display device may further include a capping layer disposed between the second electrode and the color conversion layers.

The light-emitting display device may further include a pixel defining layer disposed on the insulating layer and having openings, wherein the plurality of color conversion layers may be disposed in the openings.

The emission layer may form a tandem structure including a quantum dot emitting blue.

The first substrate may include a first emission area, a second emission area, and a non-emission area disposed between the first emission area and the second emission area, wherein the emission layer may be continuous throughout the first emission area, the second emission area, and the non-emission area.

A light emitting display device according to an exemplary embodiment of the present disclosure includes: a first substrate; an insulating layer disposed on the first substrate; a light emitting device disposed on the insulating layer and including an emission layer, a plurality of color conversion layers disposed on the light emitting device, and a reflective metal layer disposed on the plurality of color conversion layers. The emission layer includes semiconductor nano particles.

The reflective metal layer may include an inclined portion.

The inclined portion of the reflective metal layer may be disposed in an opening between a first color conversion layer and a second color conversion layer adjacent to each other.

The light-emitting display device may further include a blue light-blocking filter overlapping the first color conversion layer and the second color conversion layer, wherein the blue light-blocking filter may be disposed between the first substrate and the insulating layer.

A light emitting display device according to an exemplary embodiment of the present disclosure includes: a first substrate; a plurality of color conversion layers disposed on the first substrate; an insulating layer disposed on the plurality of color conversion layers; and a light emitting device disposed on the insulating layer and including an emission layer and a reflective electrode. The emission layer includes semiconductor nano particles.

The light-emitting device may include a first electrode disposed on the insulating layer, the emission layer disposed on the first electrode, and a second electrode disposed on the emission layer, wherein the reflective electrode may be the second electrode.

The plurality of color conversion layers may include a first color conversion layer and a second color conversion layer, wherein the light emitting display device further includes a transmission layer adjacent to at least one selected from the group consisting of the first color conversion layer and the second color conversion layer in a direction parallel to an upper surface of the first substrate, and the transmission layer may include a plurality of scatterers.

According to the exemplary embodiment of the present disclosure, the light-emitting display device with improved color reproducibility and reduced color shift can be implemented.

DETAILED DESCRIPTION OF THE EMBODIMENTS

Figure 1:
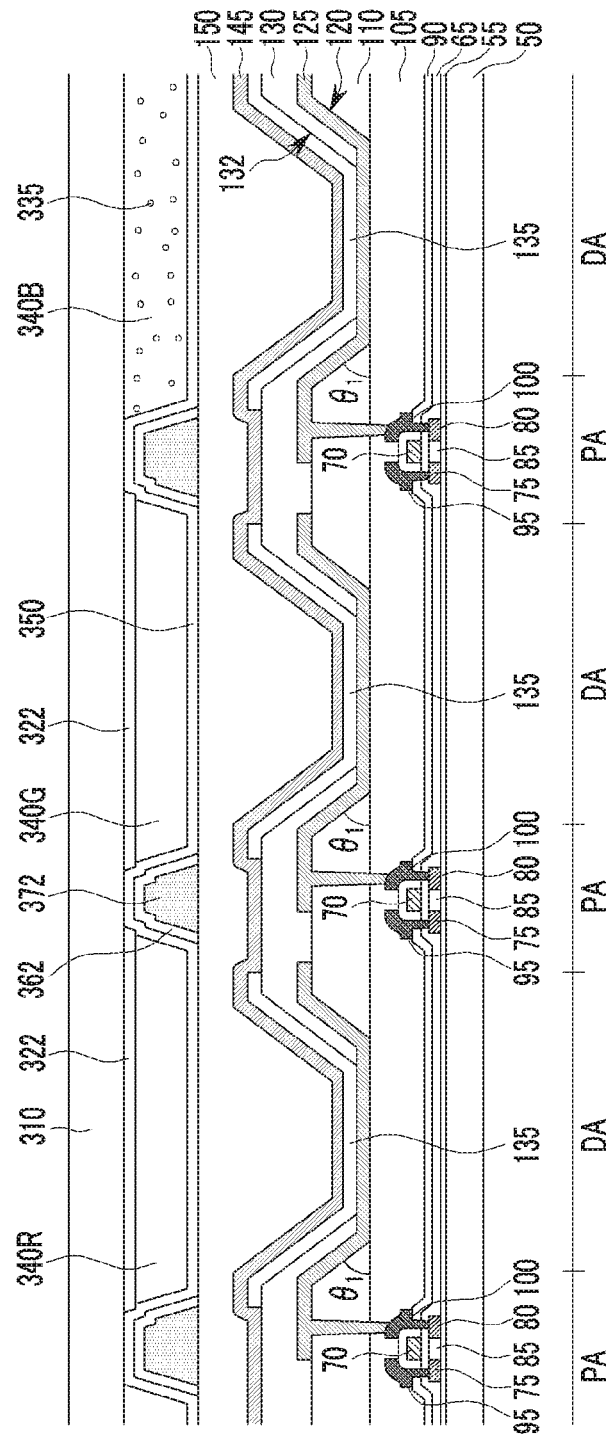
FIG. 1 is a cross-sectional view of a light emitting display device according to an exemplary embodiment of the present disclosure.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thickness of layers, films, panels, regions, etc. are exaggerated for clarity. In the drawings, for ease of description, the thicknesses of some layers and regions are exaggerated.

In addition, It will be understood that when an element such as a layer, film, region, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the word "on a plane" means viewing target portion from the top, and the word "on a cross-section" means viewing cross-section formed by vertically cutting a target portion from the side.

Figure 2:
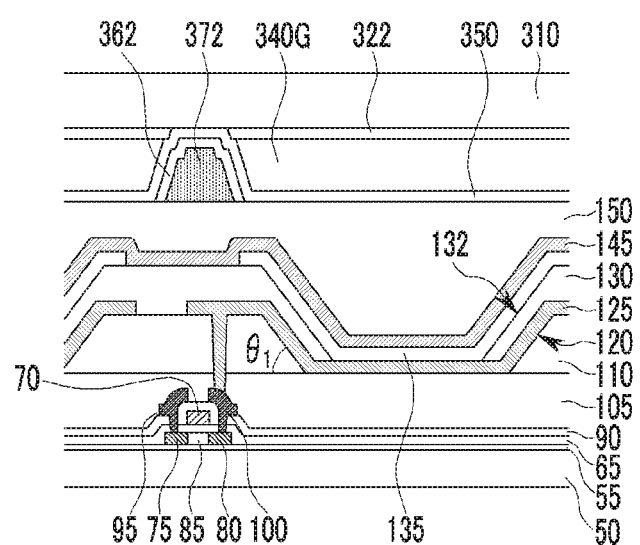
FIG. 2 is a cross-sectional view of a green pixel area in the exemplary embodiment of FIG. 1.
Figure 3:
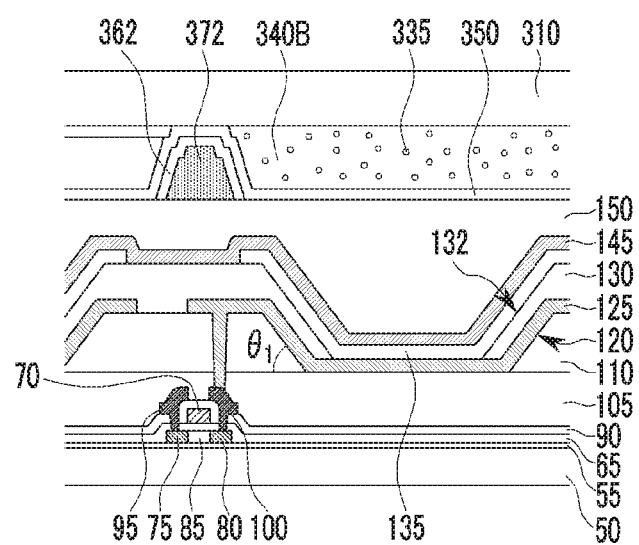
FIG. 3 is a cross-sectional view of a blue pixel area in the exemplary embodiment of FIG. 1.
Figure 4:
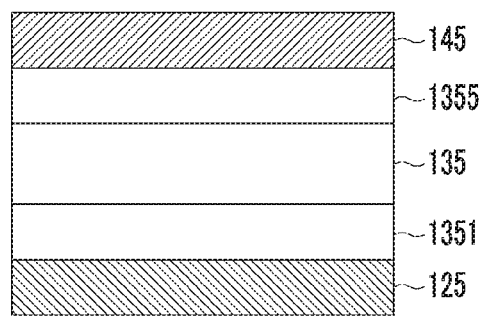
FIG. 4 is a cross-sectional view of light emitting device of the light-emitting display device of FIG. 1.

FIG. 1 is a cross-sectional view of a light emitting display device according to an exemplary embodiment of the present disclosure. FIG. 2 is a cross-sectional view of a green pixel area in the exemplary embodiment of FIG. 1. FIG. 3 is a cross-sectional view of a blue pixel area in the exemplary embodiment of FIG. 1. FIG. 4 is a cross-sectional view of a light emitting device of the light-emitting display device of FIG. 1.

Referring to FIG. 1, a buffer layer 55 is disposed on a first substrate 50. The first substrate 50 may be transparent.

The buffer layer 55 may perform a function of preventing diffusion of metal atoms, impurities, and the like from the first substrate 50. For example, the buffer layer 55 may include a silicon oxide, a silicon nitride, a silicon oxynitride, a silicon oxycarbide, a silicon carbonitride, etc. The buffer layer 55 may be omitted.

A semiconductor layer is disposed on the buffer layer 55. The semiconductor layer may include a plurality of extrinsic regions including an n-type or p-type conductive impurity, and at least one intrinsic region including no conductive impurity.

In the semiconductor layer, the extrinsic regions include source and drain regions 75 and 80, which are doped with a p-type impurity and are separated from each other. A channel region 85 is provided between the source region 75 and the drain region 80. Alternatively, the extrinsic regions 75 and 80 of the semiconductor layer may be doped with an n-type impurity.

A gate insulating layer 65 made of a silicon oxide or a silicon nitride is disposed on the semiconductor layer and the buffer layer 55.

A gate electrode 70 is disposed on the gate insulating layer 65. The gate electrode 70 is disposed on a portion of the gate insulating layer 65 below which the semiconductor layer is disposed.

Although not illustrated, a gate line connected to the gate electrode 70 is disposed on the gate insulating layer 65.

An interlayer insulating layer 90 covering the gate electrode 70 may be disposed on the gate insulating layer 65. The interlayer insulating layer 90 may be formed on gate insulating layer 65 to have a uniform thickness according to a profile of the gate electrode 70. Accordingly, a step portion adjacent to the gate electrode 70 may be formed in the interlayer insulating layer 90. A silicon compound including a silicon oxide, a silicon nitride, a silicon oxynitride, etc. may be used to form the interlayer insulating layer 90. The interlayer insulating layer 90 may perform a function of insulating the gate electrode 70 from source and drain electrodes 95 and 100 to be described below.

The source electrode 95 and the drain electrode 100 are disposed on the interlayer insulating layer 90. The source and drain electrodes 95 and 100 are separated based on the gate electrode 70 while having a predetermined gap therebetween, and are disposed adjacent to the gate electrode 70. For example, the source and drain electrodes 95 and 100 may be respectively extended from the interlayer insulating layer 90 disposed on the source and drain regions 75 and 80 to the interlayer insulating layer 90 disposed on the gate electrode 70. In addition, the source and drain electrodes 95 and 100 penetrate the interlayer insulating layer 90 such that they are respectively connected to the source and drain regions 75 and 80.

The source and drain electrodes 95 and 100 may respectively include a metal, an alloy, metal nitride, a conductive metal oxide, a transparent conductive material, etc.

Although not illustrated, a data line crossing the gate line is disposed on the interlayer insulating layer 90 such that it is connected to the source electrode 95.

A planarization layer 105 is disposed on the source electrode 95 and the drain electrode 100. The planarization layer 105 may have a sufficient thickness to completely cover the source electrode 95 and the drain electrode 100. The planarization layer 105 may include an organic material, an inorganic material, etc.

An insulating layer 110 having an inclined portion 120 is disposed on the planarization layer 105. A contact hole, which also penetrates the planarization layer 105 to partially extend to and expose the drain electrode 100, is formed in the insulating layer 110. The drain electrode 100 may be electrically connected to a first electrode 125 to be described below via the contact hole.

The insulating layer 110 according to the current exemplary embodiment has a partially depressed portion. The partially depressed portion may, as shown in FIG. 2, expose some of a top surface of the planarization layer 105. A side surface connecting the partially depressed portion of the insulating layer 110 to the other portion of the insulating layer 110 that is not depressed may form the inclined portion 120. In the current exemplary embodiment, the inclined portion 120 has a first inclination angle $\theta_1$, and the first inclination angle $\theta_1$ may be greater than 0 degrees and smaller than 90 degrees. The first inclination angles $\theta_1$ of the three respective emission areas DA illustrated in FIG. 1 are illustrated to be the same as each other, but in order to improve color shift associated with a viewing angle, the inclination angles of the respective emission areas may be designed to be different from each other.

The first electrode 125 is disposed on the insulating layer 110. The first electrode 125 is filled into the contact hole described above such that it is connected to the drain electrode 100. In the current exemplary embodiment, the first electrode 125 covers the partially depressed portion of the insulating layer 110, and includes an inclined portion that is disposed along the inclined portion 120. The inclined portion of the first electrode 125 may be inclined based on a surface that is substantially parallel to the first substrate 50. In this case, the inclined portion of the first electrode 125 may cover most of the inclined portion 120 of the insulating layer 110. In addition, as illustrated in FIG. 2, the first electrode 125 may contact the top surface of the planarization layer 105 in the partially depressed portion of the insulating layer 110.

The light emitting display device including the insulating layer 110 having the inclined portion 120 as in the current exemplary embodiment may be a top emission type in which light is finally emitted in a direction toward the insulating layer 110 from the first substrate 50. In this case, the first electrode 125 may include a reflective material.

In the present disclosure, the reflective electrode may be defined as an electrode including a material having a characteristic of reflecting light emitted from an emission layer 135 to be transmitted to a second electrode 145. The reflection characteristic may mean that reflectivity of incident light is about 70% or more to about 100% or less, or about 80% or more to about 100% or less.

The first electrode 125 may include silver (Ag), aluminum (Al), chromium (Cr), molybdenum (Mo), tungsten (W), titanium (Ti), gold (Au), palladium (Pd), or alloys thereof to be used as the reflection layer while having the anode function, and may a triple layer structure of silver (Ag)/indium tin oxide (ITO)/silver (Ag) or indium tin oxide (ITO)/silver (Ag)/indium tin oxide (ITO).

The first electrode 125 may be formed by using a sputtering method, a vapor phase deposition method, an ion beam deposition method, or an electron beam deposition method.

A pixel defining layer 130 is disposed on the insulating layer 110 and the first electrode 125. The pixel defining layer 130 may be formed of an organic material, an inorganic material, etc. For example, the pixel defining layer 130 may include an organic material such as a photoresist, a polyacrylate resin, a polyimide resin, an acryl-based resin, etc., or an inorganic material such as a silicon compound. In one exemplary embodiment, the pixel defining layer 130 may also be formed of a photoresist including a black pigment, in which case the pixel defining layer 130 may serve as a light blocking member.

Scattering particles having a nano-structure may be dispersed in the pixel defining layer 130. The scattering particles may include inorganic particles or polymer particles. For example, the scattering particles may include inorganic particles such as silica, $TiO_2$, $ZrO_2$, etc., or polymer particles such as polystyrene, polymethyl methacrylate (PMMA), etc.

An opening 132 extending to and exposing some of the first electrode 125 is formed be pixel defining layer 130. A side surface of the pixel defining layer 130 formed by the opening 132 may have an inclined structure, and an inclination angle of the inclined structure may be substantially the same or similar to the first inclination angle $\theta_1$ of the insulating layer 110. A range being substantially the same or similar may correspond to a difference being greater than about 0 degrees and smaller than about 5 degrees. Unlike the exemplary embodiment described above, the inclination angle of the pixel defining layer 130 having the inclined structure may be different from the first inclination angle $\theta_1$ regardless of the first inclination angle $\theta_1$ of the insulating layer 110.

The pixel defining layer 130 may define the emission area DA and a non-emission area PA in the light emitting display device. An area where the opening 132 of the pixel defining layer 130 is disposed corresponds to the emission area DA, while an area where the pixel defining layer 130 except for the opening 132 is disposed corresponds to the non-emission area PA. The emission area DA may correspond to a portion of the emission layer 135 to be described below from which light is emitted, while the non-emission area PA may correspond to the rest of the area other than the emission area DA.

Most of the inclined portion 120 of the insulating layer 110 is disposed in the emission area DA, and the first electrode 125 is disposed in the emission area DA to cover a side surface of the inclined portion 120. In this case, the pixel defining layer 130 covers a portion of the first electrode 125 in the emission area DA that covers the side surface of the inclined portion 120.

The emission layer 135 is disposed on the first electrode 125 that is disposed in the emission area DA, and a second electrode 145 is disposed on the emission layer 135. The first electrode 125, the emission layer 135, and the second electrode 145 may configure the light emitting device.

In the exemplary embodiment illustrated in FIG. 1, the emission layer 135 may be extended along the side surface of the inclined structure of the pixel defining layer 130 such that it is disposed on some of a top surface of the pixel defining layer 130. However, in a modified exemplary embodiment, the emission layer 135 may be disposed only in a portion of the first electrode 125 substantially exposed by the opening 132, or may be disposed only in a portion of the first electrode 125 exposed by the opening 132 and extended therefrom to be disposed only at an inclined side surface of the pixel defining layer 130.

Although not shown in FIG. 1, the light emitting display device may further include an auxiliary layer of a hole injection layer, a hole transporting layer, etc. between the first electrode 125 and the emission layer 135, and also include an auxiliary layer of an electron injection layer, an electron transporting layer, etc. between the second electrode 145 and the emission layer 135. The emission layer 135 according to the present exemplary embodiment includes semiconductor nano particles. The semiconductor nano particles according to the present exemplary embodiment may include a quantum dot emitting blue. Next, a light emitting device including the emission layer 135 including the semiconductor nano particles will be described with reference to FIG. 4

Referring to FIG. 4, the light emitting device includes a hole transporting region 1351 disposed on the first electrode 125, an emission layer 135 disposed on the hole transporting region 1351, an electron transporting region 1355 disposed on the emission layer 135, and the second electrode 145 disposed on the electron transporting region 1355.

The hole transporting region 1351 may include an auxiliary layer that is disposed between the first electrode 125 and the emission layer 135. The hole transporting region 1351 may include at least one of the hole transporting layer and the hole injection layer. The hole transporting layer may perform a function of efficiently transporting holes transferred from the first electrode 125. The hole transporting layer may include an organic material. For example, the hole transporting layer may include N,N-dinaphthyl-N,N'-diphenyl benzidine (NPD), TPD (N,N'-bis-(3-methylphenyl)-N,N'-bis-(phenyl)-benzidine), s-TAD, 4,4',4''-tris-(N-3-methylphenyl-N-phenyl-amino)-triphenylamine (MTDATA), and the like, but it is not limited thereto.

The emission layer 135 includes a plurality of quantum dots, a material for forming the emission layer 135 is not specifically limited. Further, the quantum dots included in the emission layer 135 according to the exemplary embodiment may have a core shell structure where one semiconductor material surrounds another semiconductor material. An interface between the core and the shell may have a concentration gradient, such that a concentration of an element existing in the shell is gradually reduced nearing the center thereof.

Each of the core and the shell may include at least two of Mg, Zn, Te, Se, and S, and particularly a content of Mg included in the shell may be larger than a content of Mg included in the core.

Specifically, the band gap energy of the semiconductor increases as the Mg content increases. If the content of Mg included in the shell is larger than the content of Mg included in the core, the band gap energy of the shell is provided in a form that encompasses the band gap energy of the core, so that more stable hole/electron injection is possible.

In other words, when the shell includes more Mg than the core, the shell has a lower HOMO energy level than that of the core while the shell may have a higher LUMO energy level than that of the core. According to the relationship between the core/shell energy levels, it is possible to efficiently inject holes and electrons, thereby increasing the luminous efficiency of the light emitting device.

The core may include at least one of $Zn_{1-x}Mg_xSe$, $Zn_{1-x}Mg_xS$, and $Zn_{1-x}Mg_xTe$, wherein x is greater than or equal to 0 and less than or equal to 1. The shell may include at least one of $Zn_{1-y}Mg_yTe$, $Zn_{1-y}Mg_ySe$, and $Zn_{1-y}Mg_yS$, wherein y is greater than or equal to 0 and less than or equal to 1. In this case, the core may not include Mg, so that the content of Mg included in the shell may be larger than the content of Mg included in the core, and for example, the core may be a ZnTe material and the shell may be MgTe.

Further, when the core includes at least one of $Zn_{1-x}Mg_xSe$, $Zn_{1-x}Mg_xS$, and $Zn_{1-x}Mg_xTe$, and the shell includes at least one of $Zn_{1-y}Mg_yTe$, $Zn_{1-y}Mg_ySe$, and $Zn_{1-y}Mg_yS$, the shell and core have similar crystal structures and have similar lattice constant values. A similar lattice constant value indicates good matching between the core and the shell.

Specifically, when the crystal structures have a zinc blend structure, the lattice constant of ZnTe is 6.103, the lattice constant of MgTe is 6.280, and the lattice constant of CdTe is 6.478. In this case, according to an exemplary embodiment, the difference between the lattice constants of ZnTe (core MgTe (shell) may be smaller than the difference between the crystal constants of ZnTe (core) and CdTe (shell), and this indicates that the quantum dots according to the exemplary embodiment can be excellent in terms of lattice matching.

An average particle diameter of the core of the core/shell quantum dot may be about 2 nm to about 5 nm. Meanwhile, an average thickness of the shell may be about 3 nm to about 5 nm. Further, the average particle diameter of the quantum dot may be about 2 nm to about 10 nm.

In the aforementioned range, by variously selecting the particle diameter of the core, the average thickness of the shell, and the average particle diameter of the quantum dots, light emitting colors of the quantum dots and/or semiconductor characteristics of the quantum dots and the like may be variously changed.

In the present exemplary embodiment, the emission layer 135 may emit blue.

The electron transporting region 1355 may be disposed on the emission layer 135. The electron transporting region 1355 may include the auxiliary layer that is disposed between the emission layer 135 and the second electrode 145. The electron transporting region 1355 may include at least one of the electron transporting layer and the electron injection layer. In this case, the electron transporting layer may include an organic material. For example, the electron transporting layer may be made of at least one selected from a group of tris(8-hydroxyquinolino)aluminum (Alq3), 2-[4-biphenyl-5-[4-tert-butylphenyl]]-1,3,4-oxadiazole (PBD), 1,2,4-triazole (TAZ), spiro-2-[4-biphenyl-5-[4-tert-butylphenyl]]-1,3,4-oxadiazole (spiro-PBD), and 8-hydroxyquinoline beryllium salt (BAlq), but it is not limited thereto.

Figure 5:
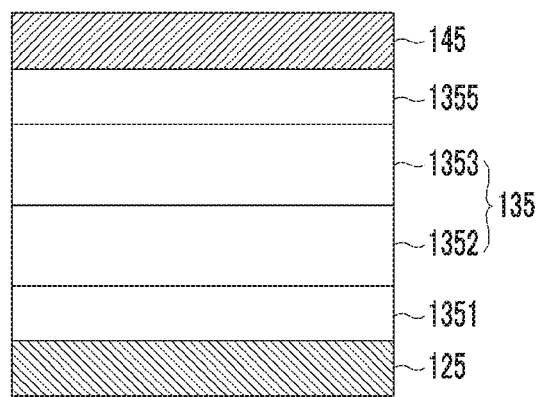
FIG. 5 is a cross-sectional view of a tandem structure in which the light emitting device of FIG. 4 is modified.

FIG. 5 is a cross-sectional view of a tandem structure in which the light emitting device of FIG. 4 is modified.

Referring to FIG. 5, the light emitting device according to the current exemplary embodiment of the present disclosure may have a tandem type of structure. For example, the emission layer 135 may include two layers 1352 and 1353 that respectively emit the same color or different colors. The two layers 1352 and 1353 respectively emitting the same color may be blue emission layers. One of the two layers 1352 and 1353 emitting different colors may be a blue emission layer and the other of the two layers 1352 and 1353 emitting different colors may be a green emission layer or a yellow emission layer. Light generated in each of two emission layers may be mixed to emit a color that represents blue or white. While not being limited thereto, the emission layer 135 may include three layers that respectively emit different colors or include two layers of three layers that emit the same color and one layer of three layers that emit different color from the other two layers. In this case, the three layers may respectively emit red, green, and blue or blue, yellow, and blue, and light generated in each of the three layers may be mixed to emit a color that represents blue or white.

Although not illustrated, a charge generation layer may be disposed between the two layers 1352 and 1353. The charge generation layer is generally formed between the neighboring emission layers, serving to control charge balance between the adjacent emission layers.

Referring back to FIG. 1, the second electrode 145 is disposed on the emission layer 135 and the pixel defining layer 130. The second electrode 145 may be a transflective electrode.

In the present disclosure, the transflective electrode may be defined as an electrode including a material having a transflective characteristic transmitting part of light incident to the second electrode 145 and reflecting a remaining part of the light to the first electrode 125. Here, the transflective characteristic may mean that the reflectivity for the incident light is about 0.1% or more to about 70% or less, or about 30% or more to about 50% or less.

The second electrode 145 may include silver (Ag), magnesium (Mg), aluminum (Al), chromium (Cr), molybdenum (Mo), tungsten (W), titanium (Ti), gold (Au), palladium (Pd), ytterbium (Yb), or alloys thereof. As above-described, for explaining a resonant structure, the transflective electrode is used as the second electrode 145. However, in a modified embodiment, when a non-resonant structure is applied, the second electrode 145 may be a transparent conductive electrode such ITO or IZO.

As shown in FIG. 1, the second electrode 145 may be extended from the emission area DA to the non-emission area PA. The second electrode 145 is not limited thereto, and it may be disposed in the emission area DA or only at a top surface of the emission layer 135.

A capping layer 150 is disposed on the second electrode 145. The capping layer 150 may be extended from the emission area DA to the non-emission area PA. The capping layer 150 may be formed of an organic material, an inorganic material, etc. For example, the capping layer 150 may include a photoresist, an acryl-based polymer, a polyimide-based polymer, a polyamide-based polymer, a siloxane-based polymer, a photosensitive acryl carboxylic group-containing polymer, a novolac resin, an alkali soluble resin, a silicon oxide, a silicon nitride, a silicon oxynitride, a silicon oxycarbide, a silicon carbonitride, aluminum, magnesium, zinc, hafnium, zirconium, titanium, tantalum, an aluminum oxide, a titanium oxide, a tantalum oxide, a magnesium oxide, a zinc oxide, a hafnium oxide, a zirconium oxide, a titanium oxide, etc. They may be used alone or in combination.

A first color conversion layer 340R, a second color conversion layer 340G and a transmission layer 340B are disposed on the capping layer 150. A light blocking member 372 is disposed between the neighboring first and second color conversion layers 340R and 340G, between the first color conversion layer 340R and the transmission layer 340B, and between the second color conversion layer 340G and the transmission layer 340B. The light blocking member 372 may more effectively prevent color mixture that is generated between the adjacent color conversion layers 340R and 340G and between the adjacent color conversion layers 340R and 340G and the transmission layer 340B.

A green pixel area including the second color conversion layer 40G and a red pixel area having a configuration substantially similar to that of the green pixel area will now be described with reference to FIG. 2.

Referring to FIGS. 1 and 2, a light filtering layer 350 is disposed between the capping layer 150 and the second color conversion layer 340G. The light filtering layer 350 is also disposed between the neighboring color conversion layers 340R and 340G and between the neighboring color conversion layers 340R and 340G and the transmission layer 340B, and in this case, may be disposed between a second substrate 310 and a light blocking member 372 to be described below in a direction substantially perpendicular to the first substrate 50. The light filtering layer 350 serves a function of increasing light efficiency by reflecting the light generated from the first and second color conversion layers 340R and 340G. In detail, when a blue light generated from the emission layer 135 meets semiconductor nano particles of the color conversion layer 340R and 340G, the blue light is scattered with Lambertian distribution in red or green. At this time, the light filtering layer 350 serves a function of guiding light toward a front surface by recycling red light or green light to emit a side surface and a lower surface.

The light filtering layer 350 includes a plurality of layers, and the plurality of layers may have a structure in which at least two or more layers having different refractive indexes from each other are alternately arranged in a direction substantially perpendicular to the first substrate 50.

An auxiliary metal layer 362 is disposed between the second color conversion layer 340G and the light blocking member 372. The auxiliary metal layer 362 may be a metal material to reflect light, and the auxiliary metal layer 362 increases the amount of light emitted to a user by reflecting light to enter the auxiliary metal layer 362 back into the color conversion layer 340R and 340G, the transmission layer 340B or the second substrate 310. The auxiliary metal layer 362 may be omitted.

A blue light-blocking filter 322 is disposed on the second color conversion layer 340G. The blue light-blocking filter 322 is also disposed on the first color conversion layer 340R. The blue light-blocking filter 322 performs a function to be described below. When the emission layer 135 including a material for emitting blue is used, color mixture is prevented from being generated during a process of implementing green when blue light passes through the first color conversion layer 340R and the second color conversion layer 340G. Specifically, the blue light-blocking filter 322 does not let a blue light not absorbed in the first color conversion layer 340R and the second color conversion layer 340G to go outside, such that the blue light-blocking filter 322 overlapping the first color conversion layer 340R may transmit pure red light not mixed with a blue light, and the blue tight-blocking filter 322 overlapping the second color conversion layer 340G may transmit pure green light not mixed with a blue light.

In FIGS. 1, 2, two blue light-blocking filters 322 are disposed respectively in a region corresponding to the first color conversion layer 340R and the second color conversion layer 340G. Although FIGS. 1, 2 show that the lwo blue light-blocking filters 322 in each region are separated from each other, the blue light-blocking filter 322 formed on the first color conversion layer 340R and the blue light-blocking filter 322 formed on the second color conversion layer 340G may be connected with each other.

In the present exemplary embodiment, the first and second color conversion layers 340R and 340G and the transmission layer 340B may include a photosensitive resin. The quantum dots included in the first and second color conversion layers 340R and 340G may be selected from a group II-VI compound, a group III-V compound, a group IV-VI compound, a group IV element, a group IV compound, and a combination thereof.

The group II-VI compound may be selected from: a two-element compound selected from a group of CdSe, CdTe, ZnS, ZnSe, ZnTe, ZnO, HgS, HgSe, HgTe, MgSe, MgS, and a mixture thereof; a three-element compound selected from a group of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from a group of HgZnTeS, CdZnSeS, CdZnSeTe, CdZnSTe, CdHgSeS, CdHgSeTe, CdHgSTe, HgnSeS, HgZnSeTe, HgZnSTe, and a mixture thereof. The group compound may be selected from: a two-element compound selected from a group of GaN, GaP, GaAs, GaSb, AlN, AlP, AlAs, AlSb, InN, InP, InAs, InSb, and a mixture thereof; a three-element compound selected from a group of GaNP, GaNAs, GaNSb, GaPAs, GaPSb, AlNP, AlNAs, AlNSb, AlPAs, AlPSb, InNP, InNAs, InNSb, InPAs, InSPb, GaAlNP, and a mixture thereof; and a four-element compound selected from a group of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group IV-VI compound may be selected from: a two-element compound selected from a group of SnS, SnSe, SnTe, PbS, PbSe, PbTe, and a mixture thereof; a three-element compound selected from a group of SnSeS, SnSeTe, SnSTe, PbSeS, PbSeTe, PbSTe, SnPbSb, SnPbSe, SnPbTe, and a mixture thereof; and a four-element compound selected from a group of SnPbSSe, SnPbSeTe, SnPbSTe, and a mixture thereof. The group IV element may be selected from a group of Si, Ge, and a mixture thereof. The group IV compound may be a two-element compound selected from a group of SiC, SiGe, and a mixture thereof.

In this case, the two-element compound, the three-element compound, or the four-element compound may exist in particles at a uniform concentration, or in the same particle while being divided to have partially different concentration distributions. Alternatively, it may have a core/shell structure where one quantum dot encloses another quantum dot. An interface between the core and the shell may have a concentration gradient such that a concentration of an element existing in the shell gradually decreases closer to a center of the interface.

The quantum dot may have a full width at half maximum (FWHM) of the light-emitting wavelength spectrum that is less than about 45 nm, preferably less than about 40 nm, and more preferably less than about 30 nm, and in this range, color purity or color reproducibility may be improved. In addition, since light emitted via the quantum dot is emitted in all directions, a viewing angle of light may be improved.

Further, the quantum dot is not specifically limited to have shapes that are generally used in the technical field related to the present disclosure, and more specifically, may have a shape such as a nanoparticle having a spherical shape, a pyramidal shape, a multi-arm shape, or a cubic shape, or may be a nanotube, a nanowire, a nanofiber, a planar nanoparticle, etc.

A blue pixel area including the transmission layer 340B will now be described reference to FIG. 3.

The transmission layer 340B is made of a transparent polymer, and transmits blue light provided from the emission layer 135 to exhibit blue. The transmission layer 340B corresponding to a region for emitting blue includes a material that emits received blue even without a separate phosphor or a quantum dot. For example, the transmission layer 340B may include a polymer such as a photosensitive resin.

In the current exemplary embodiment, the transmission layer 340B may further include scatterers 335. The scatterers 335 may make luminance of light emitted from the transmission layer 340B uniform at the front and at the side. The scatterers 335 may be made of any materials that can uniformly scatter light, and as an example, may be any one of silica, hollow silica, $TiO_2$, $ZrO_2$, $Al_2O_3$, $In_2O_3$, ZnO, $SnO_2$, $Sb_2O_3$, and ITO. Here, empty space in hollow structure of hollow silica may be filled with gas or in a state of vacuum condition.

A size of the scatterer 335 may have a range of Equation 1.

$$\lambda/10 < PS_{QD} < 5\lambda \qquad \text{(Equation 1)}$$

In Equation 1, $\lambda$ is a light-emitting wavelength (nanometer) of the phosphor or the quantum dot, and $PS_{QD}$ represents an aggregated particle size (nanometer) of the phosphor or the quantum dot.

As shown in FIGS. 1 and 3, the scatterers 335 are described to be included in the transmission layer 340B, but as a modified example, the scatterers may also be included in the first color conversion layer 340R and the second color conversion layer 340G.

The transmission layer 310B may further include a blue pigment or dye. The above-described scatterers 335 reflects the external light such that the contrast ratio may be deteriorated, and to compensate for this problem, the blue pigment or dye may be added in the transmission layer 340B. The blue pigment or dye may absorb at least one among the red light and the green light included in the external light.

Referring to FIGS. 1 to 3, the second substrate 310 is disposed on the first color conversion layer 340R, the second color conversion layer 340G, and the transmission layer 340B. Although not illustrated, a λ/4 polarizer, which prevents reflection of external light, may be further included on the second substrate 310.

Figure 6:
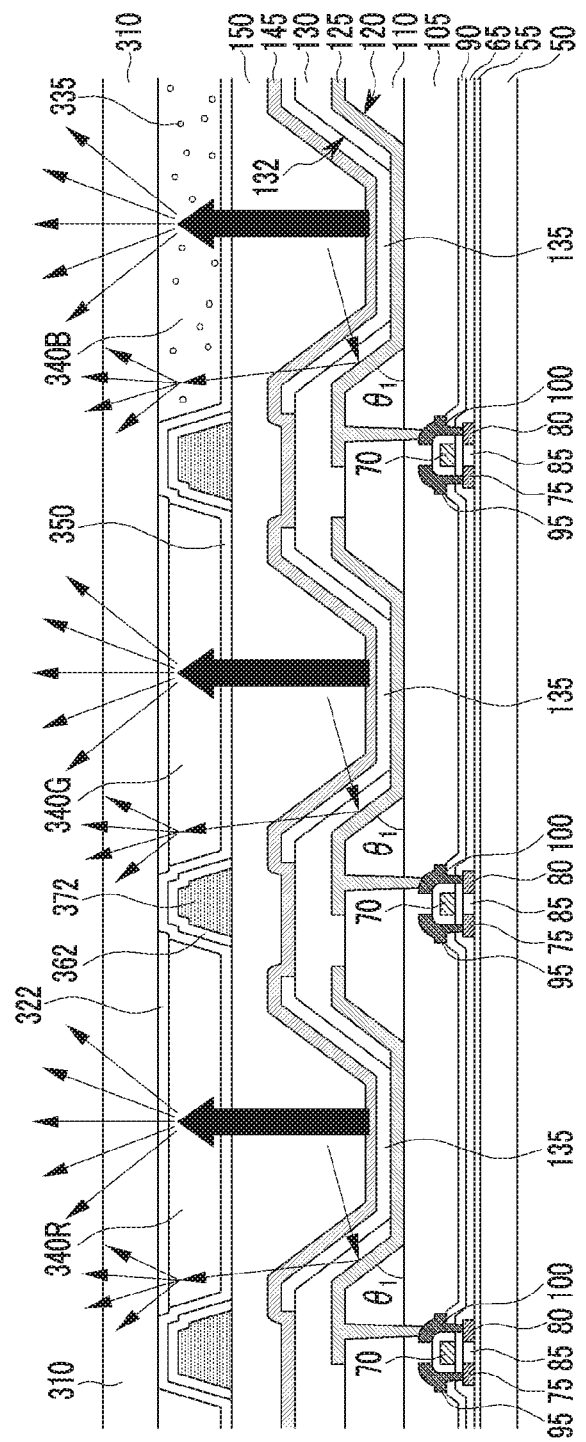
FIG. 6 is a schematic cross-sectional view of a path of light generated in an emission layer of the light emitting display device of FIG. 1.

FIG. 6 is a schematic cross-sectional view of a path of light generated in an emission layer of the light emitting display device of FIG. 1.

Referring to FIG. 6, the inclined structure included in the first electrode 125 prevents light from being totally reflected, and the light may be reflected by the first electrode 125 such that it is transmitted to the color conversion layer including the first and second color conversion layers 340R and 340G and the transmission layer 340B. Accordingly, in the light emitting display device according to the current exemplary embodiment of the present disclosure, light generated from the emission layer 135 can be totally reflected between the first electrode 125 and the second electrode 145 to prevent light loss, and light-emitting efficiency can be maximized by the color conversion layer and the transmission layer that are disposed on the light emitting device. Since the color conversion layer according to the current exemplary embodiment is formed to include at least one of the phosphor and the quantum dot, color shift which is inherent in conventional display device can be minimized. Also, since semiconductor nano particles are used as an emission layer, light is emitted in Lambertian distribution from the emission layer. Thus, efficiency can be increased more by high scattering effect.

Figure 7:
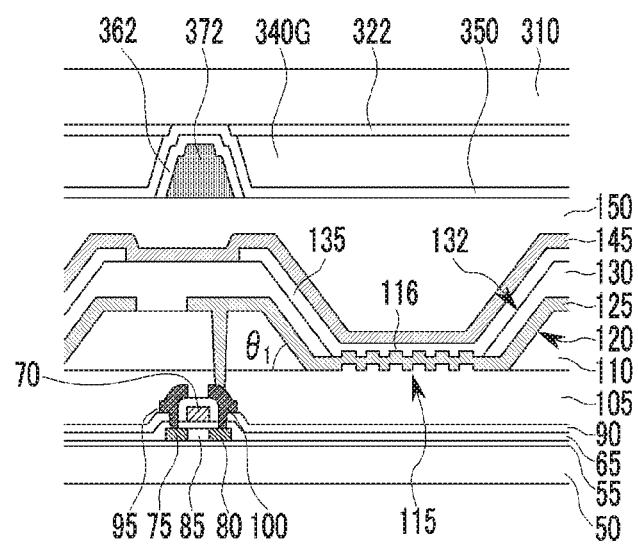
FIG. 7 is a cross-sectional view of an electrode including a protrusion-depression structure in the exemplary embodiment of FIG. 1.

FIG. 7 is a cross-sectional view of an electrode including a protrusion-depression structure 115 in the exemplary embodiment of FIG. 1.

Referring to FIG. 7, the protrusion-depression structure 115 is formed at an upper surface of the planarization layer 105 adjacent to the inclined portion 120. Due to the protrusion-depression structure 115, a surface of the first electrode 125 may have a plurality of protrusions 116. The protrusion 116 may have various planar shapes such as circular, oval, rhombus, and triangular shapes, as well as a quadrangular shape. Since the first electrode 125 has the protrusion 116, light generated from the emission layer 135 can be reflected to further improve luminous efficiency of the light emitting display device.

Figure 8:
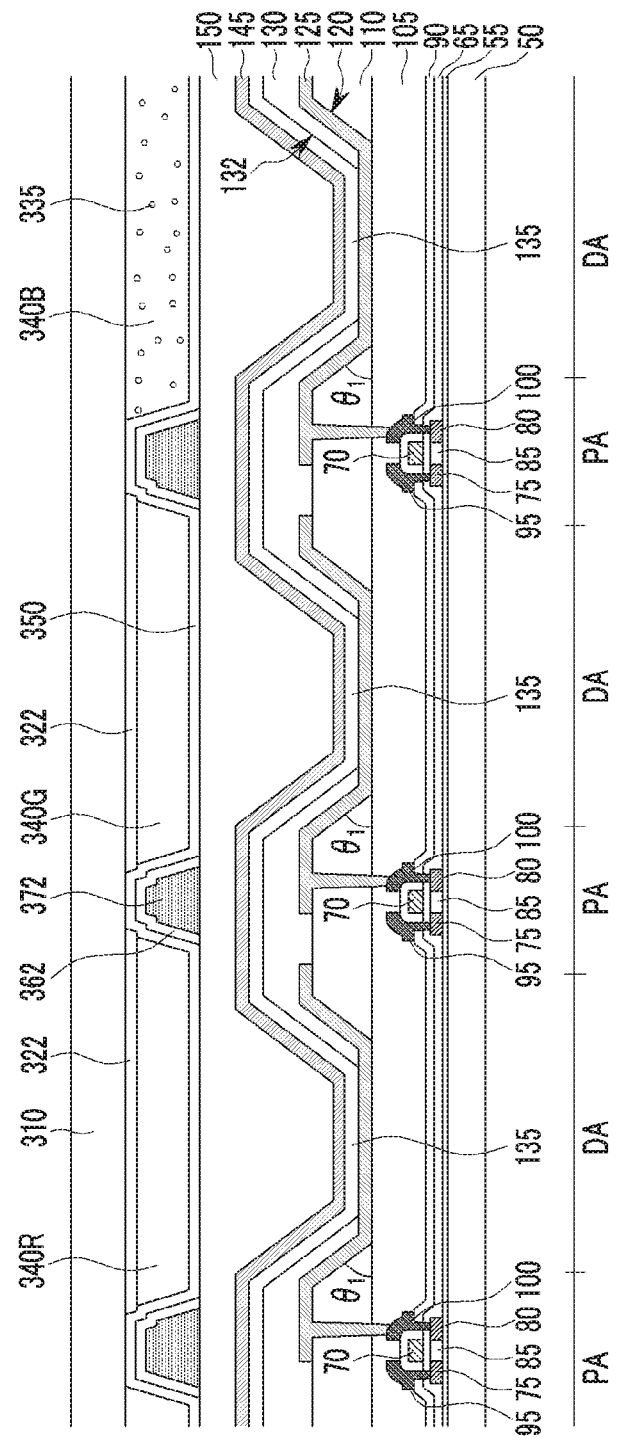
FIG. 8 is a cross-sectional view of a modified embodiment of the emission layer structure in the exemplary embodiment of FIG. 1.

FIG. 8 is a cross-sectional view of a modified embodiment of the emission layer structure in the exemplary embodiment of FIG. 1.

In the exemplary embodiment to be described in FIG. 8, most elements of FIG. 8 are substantially the same as those of the exemplary embodiment described in FIG. 1, However, the structure of the emission layer 135 of FIG. 8 is different from that FIG. 1. In the current exemplary embodiment, the emission layer 135 is formed continuously throughout an emission area DA and the non-emission area PA. The emission layer 135 may be formed by using deposition method on an entire surface. In the case of the deposition method on an entire surface, coating process may be performed by spin coating, slit coating, Inkjek/nozzle-jet printing, etc., but it is not limited thereto. Finally, the emission layer 135 is not patterned, and as shown in FIG. 8, the emission layer 135 is formed continuously throughout an emission area DA and the non-emission area PA.

Figure 9:
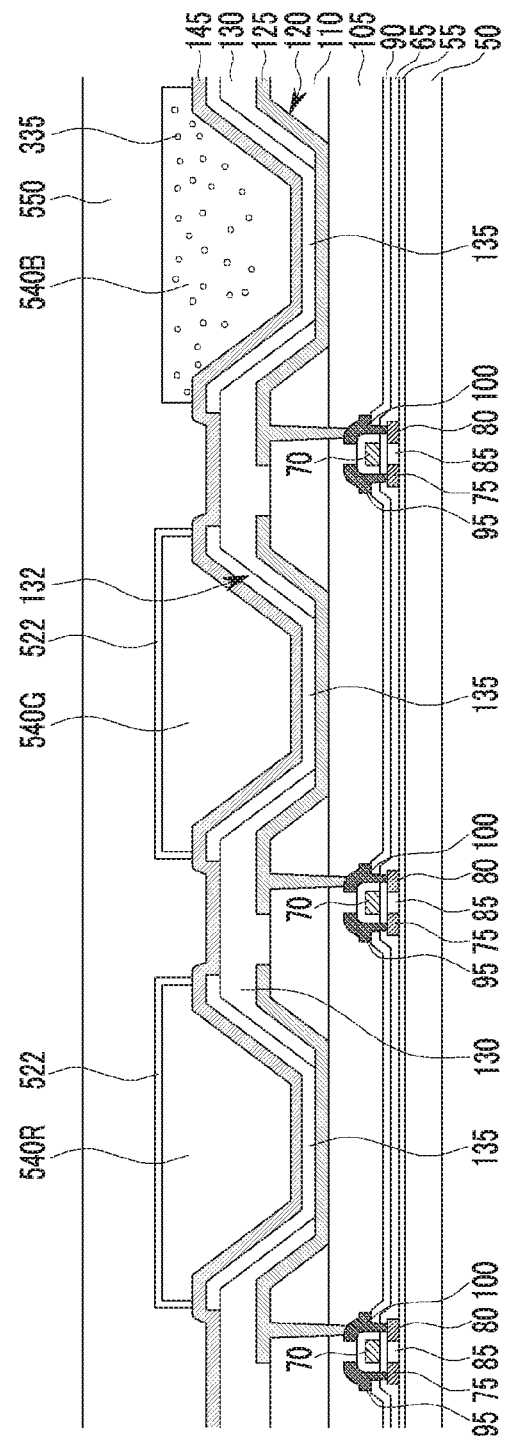
FIG. 9 is a cross-sectional view of a light emitting display device according to an exemplary embodiment of the present disclosure.

FIG. 9 is a cross-sectional view of a light emitting display device according to an exemplary embodiment of the present disclosure. In the exemplary embodiment to be described in FIG. 9, the elements disposed between the first substrate 50 and the second electrode 145 are substantially the same as those of the exemplary embodiment described in FIG. 1. However, since elements including a color conversion layer and a transmission layer are different, only differences will now be described.

Referring to FIG. 9, a first color conversion layer 540R, a second color conversion layer 540G, and a transmission layer 540B are disposed on the second electrode 145. Most of the color conversion layers 540R, 540G and the transmission layer 540B are disposed in the openings 132 of the pixel defining layer 130.

A blue light-blocking filter 522 is disposed on the first color conversion layer 540R and the second color conversion layer 540G. A capping layer 550 is disposed on the blue light-blocking filter 522 and the transmission layer 540B. In FIG. 9, two blue light-blocking filters 522 are disposed respectively in a region corresponding to the first color conversion layer 540R and the second color conversion layer 540G. Although FIG. 9 shows that the two blue light-blocking filters 522 in each region are separated from each other, the blue light-blocking filter 522 formed on the first color conversion layer 540R and the blue light-blocking filter 522 formed on the second color conversion layer 540G may be connected with each other.

In addition to the differences described above, all details described in FIGS. 1 to 7 may be applied unless they contradict the exemplary embodiment of FIG. 9.

Figure 10:
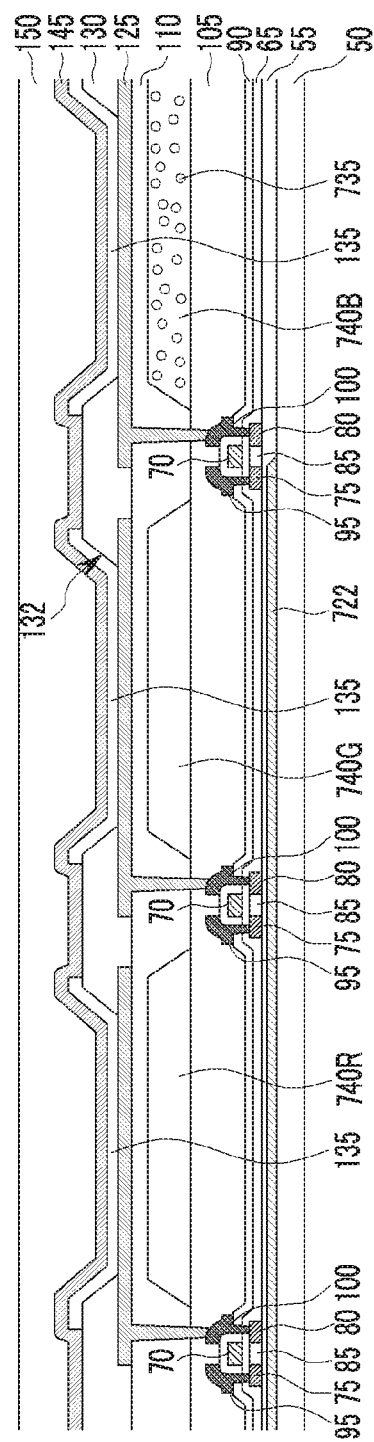
FIG. 10 is a cross-sectional view of a light emitting display device according to an exemplary embodiment of the present disclosure.
Figure 11:
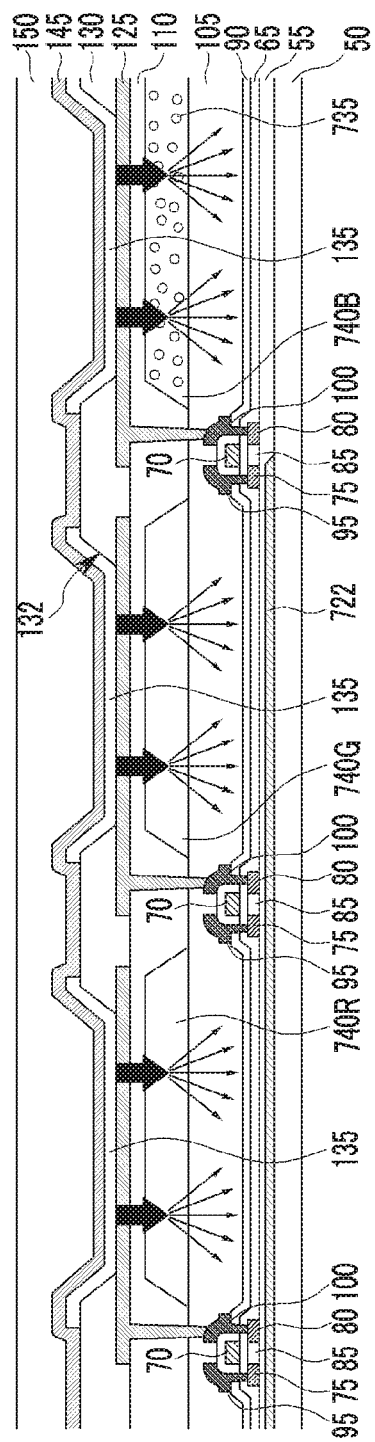
FIG. 11 is a schematic cross-sectional view of a path of light generated in an emission layer of the light emitting display device of FIG. 10.

FIG. 10 is a cross-sectional view of a light emitting display device according to an exemplary embodiment of the present disclosure. FIG. 11 is a schematic cross-sectional view of a path of light generated in an emission layer of the light emitting display device of FIG. 10.

Unlike the exemplary embodiment described in FIG. 1, the exemplary embodiment to be described in FIGS. 10, 11 represents a bottom emission structure, only differences will now be described below.

Referring to FIGS. 10, 11, a first electrode 125 may be a transflective electrode, and a second electrode 145 may be a reflective electrode. In other words, in FIG. 1, the first electrode 125 is a reflective electrode, and the second electrode 145 is a transflective electrode. However, in FIG. 10, 11, since the first electrode 125 is a transflective electrode, and the second electrode 145 is a reflective electrode, the second electrode 145 can reflect light emitted from the emission layer 135 to be transmitted to the first electrode 125.

In the present exemplary embodiment, the first color conversion layer 740R, the second color conversion layer 740G, and the transmission layer 740B including a plurality of scatterers 735 are disposed between the first substrate 50 and the light emitting device. The light emitting device includes the first electrode 125, the emission layer 135, and the second electrode 145. Specifically, the first color conversion layer 740R, the second color conversion layer 740G, and the transmission layer 740B may be formed inside the insulating layer 110, and disposed between the planarization layer 105 and the first electrode 125. Light generated in the emission layer 135 transmits through the first electrode 125, and reaches the first color conversion layer 740R, the second color conversion layer 740G, and the transmission layer 740B, thereafter, red light, green light, and blue light may be emitted. A blue light-blocking filter 722 is disposed between the first substrate 50 and the buffer layer 55 in a region corresponding to the first color conversion layer 740R and the second color conversion layer 740G.

In addition to the differences described above, all the details described in FIG. 1 may be applied unless they contradict the exemplary embodiment of FIG. 10.

Figure 12:
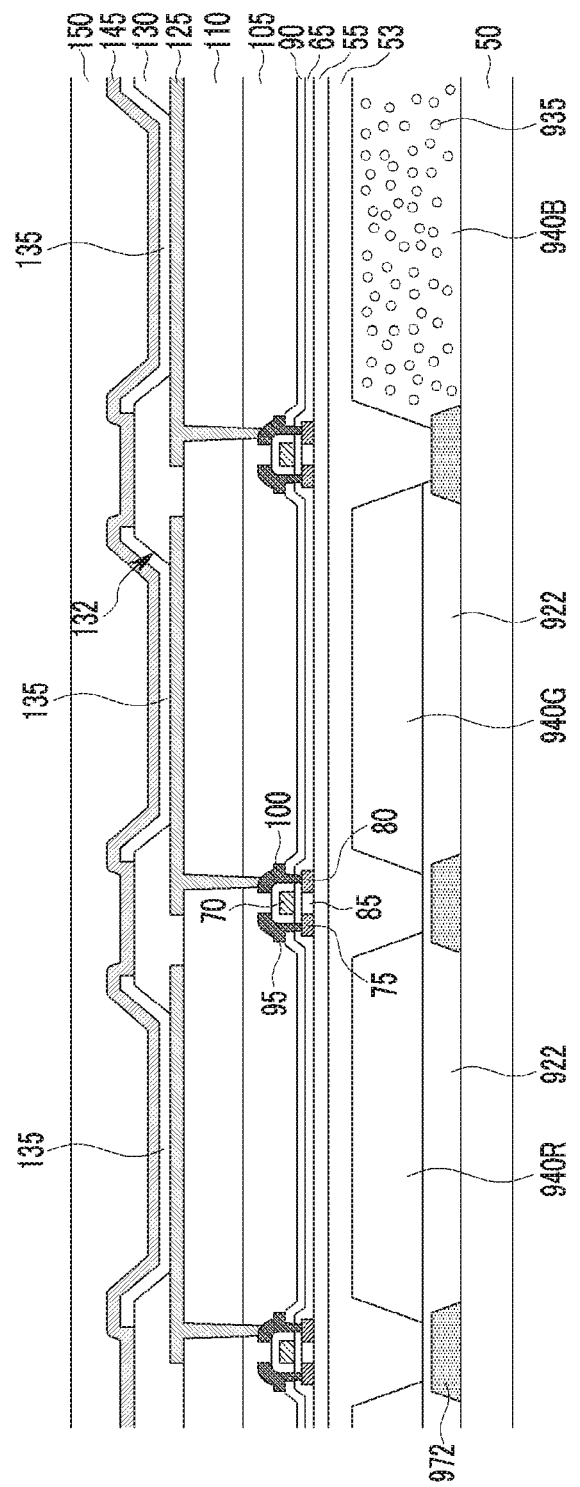
FIG. 12 is a cross-sectional view of a light emitting display device according to an exemplary embodiment of the present disclosure.
Figure 13:
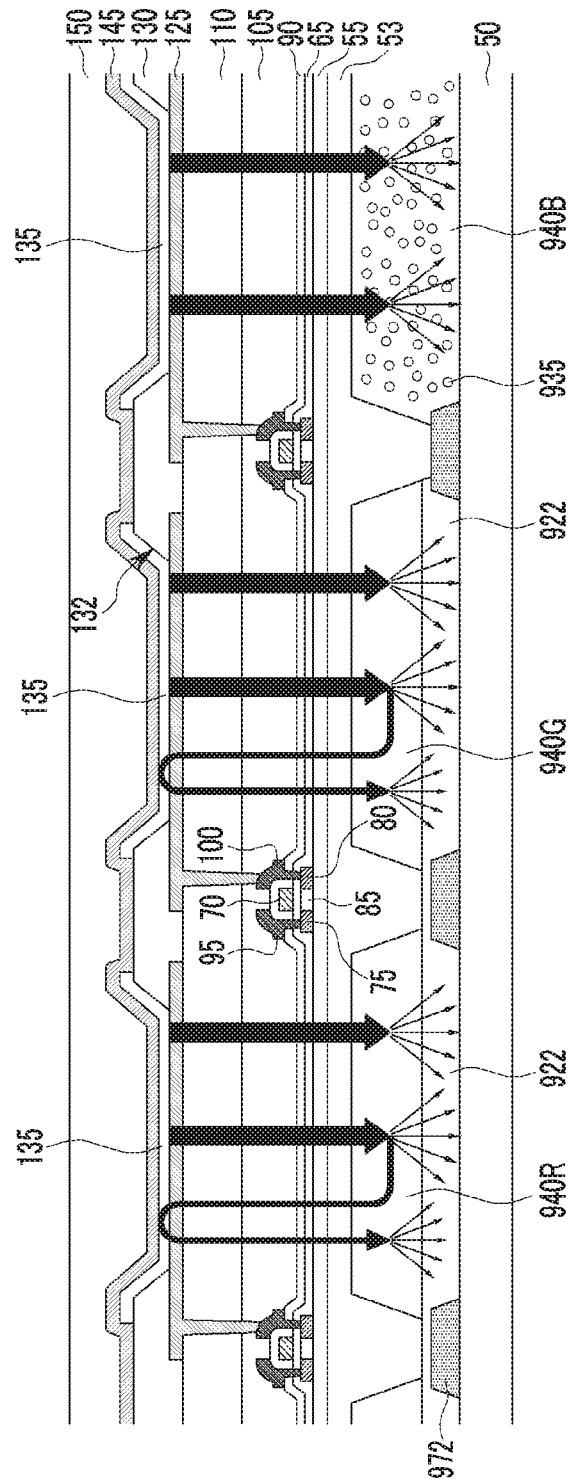
FIG. 13 is a schematic cross-sectional view of a path of light generated in an emission layer of the light emitting display device of FIG. 12.

FIG. 12 is a cross-sectional view of a light emitting display device according to an exemplary embodiment of the present disclosure. FIG. 13 is a schematic cross-sectional view of a path of light generated in an emission layer of the light emitting display device of FIG. 12. The exemplary embodiments shown in FIG. 12 is the same as most of the exemplary embodiment shown in FIGS. 10, 11 such that differences will be described.

Referring to FIG. 12 and FIG. 13, a first color conversion layer 940R, a second color conversion layer 940G, and a transmission layer 940B are disposed between the first substrate 50 and the light emitting device. Specifically, the first color conversion layer 940R, the second color conversion layer 940G, and the transmission layer 940B including a plurality of scatterers 935 may be formed between the first substrate 50 and the buffer layer 55, and a capping layer 53 may be additionally disposed below the buffer layer 55. A light blocking member 972 is disposed between the first color conversion layer 940R and the second color conversion layer 940G, between the second color conversion layer 940G and the transmission layer 940B, and between the first color conversion layer 940R and the transmission layer 940B. Also, a blue light-blocking filter 922 is disposed between the first color conversion layer 940R and the first substrate 50, and between the second color conversion layer 940G and the first substrate 50.

Figure 14:
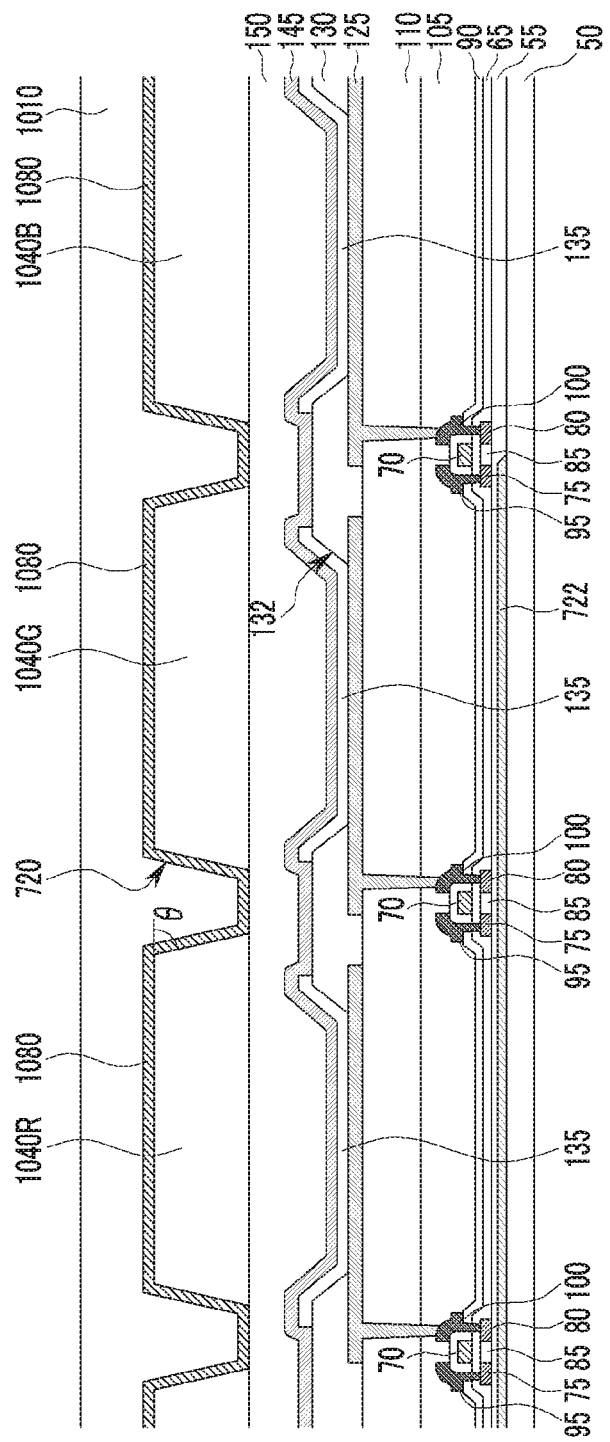
FIG. 14 is a cross-sectional view of a light emitting display device according to an exemplary embodiment of the present disclosure.

FIG. 14 is a cross-sectional view of a light emitting display device according to an exemplary embodiment of the present disclosure. In the exemplary embodiment to be described in FIG. 14, the elements disposed between the first substrate 50 and the planarization layer 105 in a direction substantially perpendicular to the first substrate 50 are substantially the same as those of the exemplary embodiment described in FIG. 1. In this case, in the present exemplary embodiment, there is only difference that a blue light-blocking filter 722 is disposed between the first substrate 50 and the buffer layer 55 in a region corresponding to the first and second color conversion layers 1040R and 1040G. However, since elements disposed on the insulating layer 110 are different, only differences will now be described.

Referring to FIG. 14, a top surface of the insulating layer 110 may not have an inclined portion hut may have a structure that is smooth in most of the region. A light emitting device, which includes first and second electrodes 125 and 145 and an emission layer 135, is disposed on an insulating layer 110. Specifically, the first electrode 125 is disposed on the insulating layer 110, and the first electrode 125 may have a structure that is smooth based on a surface substantially parallel to the first substrate 50. The first electrode 125 may include a transparent conductive material for bottom emission to be described below. For example, the first electrode 125 may include an indium tin oxide, an indium zinc oxide, a zinc tin oxide, a zinc oxide, a tin oxide, a gallium oxide, etc. They may be used alone or in combination.

A pixel defining layer 130 is disposed on the insulating layer 110 and the first electrode 125, and an opening 132 extending to and exposing some of the first electrode 125 is formed in the pixel defining layer 130. A side surface of the pixel defining layer 130 formed the by opening 132 may have an inclined structure, and the emission layer 135 is disposed in the opening 132. The second electrode 145 is disposed on the emission layer 135, and the second electrode 145 may include a transparent conductive material.

A capping layer 150 is disposed on the second electrode 145. The first color conversion layer 1040R, the second color conversion layer 1040G, and a transmission layer 1040B are disposed on the capping layer 150. The light emitting display device according to the current exemplary embodiment includes a reflective metal layer 1080 on top of the first and second color conversion layers 1040R and 1040G and the transmission layer 1040B. The reflective metal layer 1080 includes a material that has a reflective property. For example, the reflective metal layer 1080 may include a metal such as aluminum (Al), silver (Ag), platinum (Pt), gold (Au), chromium (Cr), tungsten (W), molybdenum (Mo), titanium (Ti), palladium (Pd), or iridium (Ir), and an alloy thereof. They may be used alone or in combination. In addition, the reflective metal layer 1080 may be formed to have a single-layered structure or a multi-layered structure including the metal and/or the alloy thereof described above. Alternatively, the reflective metal layer 1080 may have a triple layer structure of silver (Ag)/indium tin oxide (ITO)/silver (Ag).

In the current exemplary embodiment, the reflective metal layer 1080 has an inclined portion 720. The inclined portion 720 may be disposed in an opening formed between the first color conversion layer 1040R and the second color conversion layer 1040G, between the second color conversion layer 1040G and the transmission layer 1040B, and between the first color conversion layer 1040R and the transmission layer 1040B. In this case, the inclined portion 720 has an inclination angle $\theta$, and the inclination angle $\theta$ may be greater than 0 degrees and smaller than 90 degrees. Light generated in the emission layer 135 reaches on the first color conversion layer 1040R, the second conversion layer 1040G, and the transmission layer 1040B. The reflective metal layer 1080 having the inclined portion 720 reflects red light, green light, and blue light emitted through the first color conversion layer 1040R, the second conversion layer 1040G, and the transmission layer 1040B.

Thus, light efficiency emitted along a direction from a second substrate 1010 to be described below toward the first substrate 50 can be further improved.

The second substrate 1010 is disposed on the reflective metal layer 1080.

In addition to the differences described above, all the details described in FIGS. 1 to 7 may be applied unless they contradict the exemplary embodiment of FIG. 14.

Figure 15:
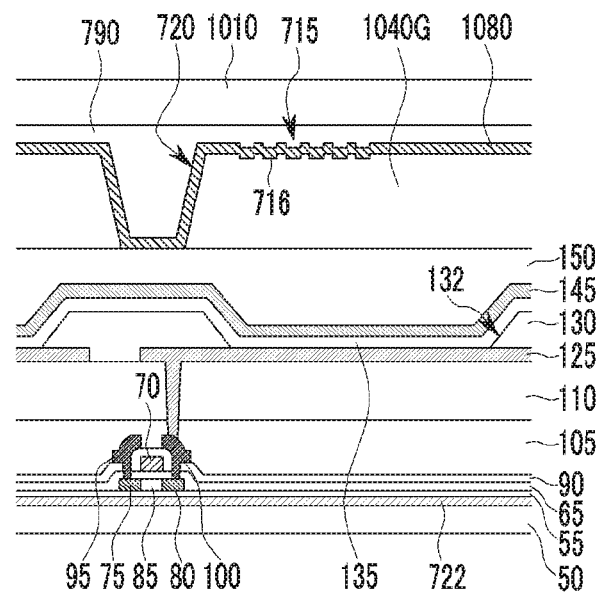
FIG. 15 is a cross-sectional view of a reflective metal layer including protrusion-depression structure in the exemplary embodiment of FIG. 14.

FIG. 15 is a cross-sectional view of a reflective metal layer including a protrusion-depression structure 715 in the exemplary embodiment of FIG. 14.

Referring to FIG. 15, a plurality of protrusions 716 are formed at a surface of a reflective metal layer 1080 having an inclined portion 720. In order to form the plurality of protrusions 716, an auxiliary layer 790 having a protrusion-depression structure 715 may be further included between a second substrate 1010 and the reflective metal layer 1080. The auxiliary layer 790 may be an organic material.

Since the reflective metal layer 1080 has the protrusions 716, light emitted from the first color conversion layer 1040R, the second color conversion layer 1040G, and the transmission layer 1040B can be reflected, thereby further improving luminous efficiency of the light emitting display device.

While this disclosure has been described in connection with what is presently considered to be practical exemplary embodiments, it is to be understood that the disclosure is not

| <Description of symbols> | |
|---|---|
| 125: first electrode | 145: second electrode |
| 116, 716: protrusion | 372, 972: light blocking member |
| 120, 720: inclined portion | 115, 715: protrusions and depression structure |
| 335, 735, 935: scatterer | 340R, 540R, 740R, 1040R: first color conversion layer |
| 340G, 540G, 740G, 1040G: second color conversion layer | |
| 340B, 540B, 740B, 1040B: transmission layer | |
| 135: emission layer | 322, 522, 722, 922: blue light-blocking filter |

What is claimed is:

1. A light emitting display device comprising:
a first substrate;
a thin film transistor disposed on the first substrate,
an insulating layer disposed on the thin film transistor and having an inclined portion and a flat portion having a hole;
a first electrode disposed on the insulating layer;
an emission layer disposed on the first electrode;
a second electrode disposed on the emission layer; and
a plurality of color conversion layers disposed on the second electrode, wherein the first electrode comprises an inclined portion that is inclined along the inclined portion of the insulating layer based on a surface parallel to the first substrate, the first electrode is connected to the thin film transistor through the hole in the flat portion, and
the emission layer includes semiconductor nano-particles;
a capping layer disposed between the second electrode and the plurality of color conversion layers; and
a light filtering layer disposed between the capping layer and the plurality of color conversion layers.

2. The light emitting display device of claim 1, further comprising:
a pixel defining layer disposed on the insulating layer,
wherein the pixel defining layer overlaps a side surface of the inclined portion of the insulating layer.

3. The light emitting display device of claim 1, further comprising:
a planarization layer disposed between the first substrate and the insulating layer,
wherein the inclined portion of the first electrode disposed on the inclined portion of the insulating layer extends such that the second electrode is disposed on the planarization layer.

4. The light emitting display device of claim 3, wherein:
the pixel defining layer comprises scattering particles having a nano-structure that are dispersed.

5. The light emitting display device of claim 1, wherein:
the inclined portion of the insulating layer has an inclination angle that is greater than 0 degrees and smaller than 90 degrees.

6. The light emitting display device of claim 1, wherein:
the first electrode comprises a reflecting material.

7. The light emitting display device of claim 6, wherein:
the first electrode comprises a plurality of protrusions.

8. The light emitting display device of claim 1, wherein:
the emission layer comprises a quantum dot emitting blue.

9. The light emitting display device of claim 8, wherein:
the plurality of color conversion layers comprise a first color conversion layer and a second color conversion layer, and
wherein the light emitting display device further comprises a transmission layer adjacent to at least one selected from the group consisting of the first color conversion layer and the second color conversion layer in a direction parallel to an upper surface of the first substrate, and the transmission layer comprises a plurality of scatterers.

10. The light emitting display device of claim 1, wherein:
the emission layer forms a tandem structure comprising a quantum dot emitting blue.

11. The light emitting display device of claim 1, wherein:
the first substrate comprises a first emission area, a second emission area, and a non-emission area disposed between the first emission area and the second emission area, and
wherein the emission layer is continuous throughout the first emission area, the second emission area, and the non-emission area.

* * * * *